(12) United States Patent
Nishioka et al.

(10) Patent No.: US 12,022,604 B2
(45) Date of Patent: Jun. 25, 2024

(54) POWER SUBSTRATE AND HIGH-VOLTAGE MODULE EQUIPPED WITH SAME

(71) Applicants: NexFi Technology Inc., Suita (JP); OSAKA UNIVERSITY, Suita (JP)

(72) Inventors: Kei Nishioka, Suita (JP); Toshio Hanada, Suita (JP); Takashi Nakamura, Suita (JP); Tsuyoshi Funaki, Suita (JP)

(73) Assignees: NaxFI Technology Inc., Osaka (JP); Osaka University, Osaka (JP)

( * ) Notice: Subject to any disclaimer, the term of this patent is extended or adjusted under 35 U.S.C. 154(b) by 11 days.

(21) Appl. No.: 17/442,404

(22) PCT Filed: Mar. 26, 2020

(86) PCT No.: PCT/JP2020/013520
§ 371 (c)(1),
(2) Date: Sep. 23, 2021

(87) PCT Pub. No.: WO2020/196699
PCT Pub. Date: Oct. 1, 2020

(65) Prior Publication Data
US 2022/0174811 A1    Jun. 2, 2022

(30) Foreign Application Priority Data

Mar. 27, 2019    (JP) ................................. 2019-061598

(51) Int. Cl.
*H05K 1/02*    (2006.01)
*H01L 25/16*   (2023.01)
*H05K 1/18*    (2006.01)

(52) U.S. Cl.
CPC ........... *H05K 1/0203* (2013.01); *H01L 25/16* (2013.01); *H05K 1/181* (2013.01); *H05K 2201/10022* (2013.01); *H05K 2201/10166* (2013.01)

(58) Field of Classification Search
CPC ...... H05K 1/02; H05K 1/0254; H05K 1/0203; H05K 1/18; H05K 1/181; H01L 23/049;
(Continued)

(56) References Cited

U.S. PATENT DOCUMENTS 5,559,374 A * 9/1996 Ohta .................... H01L 25/072
257/723
5,956,231 A * 9/1999 Yamada ............. H01L 25/0655
361/728
(Continued)

FOREIGN PATENT DOCUMENTS

JP    2015-162848 A    9/2015
JP    2017-103380 A    6/2017
(Continued)

OTHER PUBLICATIONS

Office Action dated Apr. 30, 2024 issued in the corresponding Chinese Patent Application No. 202080024766.7 with an English machine translation thereof.

*Primary Examiner* — Tuan T Dinh
(74) *Attorney, Agent, or Firm* — Carrier, Shende & Associates P.C.; Joseph P. Carrier; Jeffrey T. Gedeon

(57) ABSTRACT

A power substrate (101) of the present invention includes a plurality of insulating substrates (106) arranged side by side along a plurality of current paths (P) extending in the same direction, a plurality of MOS transistors (108) mounted on one major surface of each of the plurality of insulating substrates (106) with a first conductive layer (107) and a first solder bonding layer (109) in between, and a heat dissipation member (110) in contact with other major surfaces of all of
(Continued)

the insulating substrates with a second conductive layer (107) and a second solder bonding layer (109) in between, and each of the current paths (P) is formed by connecting one or more of the MOS transistors (108) mounted on one of the insulating substrates (106) with one or more of the MOS transistors (108) mounted on a different one of the insulating substrates (106) in series with each other.

4 Claims, 5 Drawing Sheets

(58) Field of Classification Search
CPC ............... H01L 23/49562; H01L 23/36; H01L 23/5385; H01L 24/29; H01L 24/32; H01L 24/83; H01L 25/16; H01L 25/18; H01L 25/072
USPC ........ 361/700–710, 783–784, 775–778, 803; 439/76.2; 257/690–730
See application file for complete search history.

(56) References Cited

U.S. PATENT DOCUMENTS

| | | | |
|---|---|---|---|
| 6,060,772 A * | 5/2000 | Sugawara | H01L 24/73 257/691 |
| 6,078,501 A * | 6/2000 | Catrambone | H02M 7/003 174/50.56 |
| 6,212,087 B1 * | 4/2001 | Grant | H05K 7/1432 361/715 |
| 6,774,465 B2 * | 8/2004 | Lee | H01L 25/16 257/784 |
| 7,012,810 B2 * | 3/2006 | Parkhill | H05K 7/1432 361/784 |
| 8,637,964 B2 * | 1/2014 | Jones | H01L 25/07 257/691 |
| 9,076,660 B2 * | 7/2015 | Kim | H01L 23/053 |
| 10,070,528 B2 | 9/2018 | Nakamura et al. | |
| 10,291,144 B2 | 5/2019 | Sawada | |
| 2015/0195950 A1 * | 7/2015 | Lee | H05K 3/0014 361/709 |
| 2015/0333043 A1 * | 11/2015 | Masuda | H01L 25/072 361/783 |
| 2015/0373836 A1 * | 12/2015 | Masutani | H01L 25/07 361/783 |
| 2016/0351505 A1 * | 12/2016 | Tamada | H01L 24/48 |
| 2017/0309544 A1 * | 10/2017 | Kobayashi | H05K 3/0061 |

FOREIGN PATENT DOCUMENTS

| | | |
|---|---|---|
| JP | 2017-204575 A | 11/2017 |
| WO | 2014/061211 A1 | 4/2014 |
| WO | 2016/199635 A1 | 12/2016 |

* cited by examiner

POWER SUBSTRATE AND HIGH-VOLTAGE MODULE EQUIPPED WITH SAME

TECHNICAL FIELD

The present invention relates to a power substrate and a high-voltage module equipped with the same.

The present application is based on and claims the benefit of priority of Japanese Patent Application No. 2019-061598 filed in Japan on Mar. 27, 2019, contents of which are incorporated hereby by reference.

BACKGROUND ART

It is known that SIC has a band gap three times larger and a dielectric breakdown strength about ten times higher than Si, and a semiconductor element such as an MOS transistor in which SIC is used attracts attention as a next generation power element handling a high voltage and a large current. A high-voltage module having switching properties, withstand voltage properties, temperature properties and the like improved by combining a plurality of MOS transistors in accordance with various use applications has been developed (see Patent Literature 1, for example).

CITATION LIST

Patent Literature

Patent Literature 1: Japanese Patent Laid-Open No. 2015-162845

SUMMARY OF INVENTION

Technical Problem

A plurality of MOS transistors constituting a high-voltage module are directly mounted in a discrete manner on a printed circuit board, and the transistors are connected in series with each other. In this state, heat of the mounted MOS transistors cannot be sufficiently dissipated, and hence a magnitude of current to flow through the MOS transistors has to be limited.

Furthermore, gates of the MOS transistors in the high-voltage module are configured to be individually driven by an electromagnetic induction method, and hence there is a large gate delay variation among the plurality of MOS transistors connected in series, which makes it difficult to combine the transistors to use.

An object of the present invention, which has been made in view of the above situation, is to provide a power substrate in which heat dissipation properties can be improved, and gate delay variation can be kept low, and a high-voltage module equipped with the power substrate.

Solution to Problem

To solve the above problem, the present invention employs measures as follows.

(1) A power substrate according to an aspect of the present invention includes a plurality of insulating substrates arranged side by side along a plurality of current paths extending in the same direction, a plurality of MOS transistors mounted on one major surface of each of the plurality of insulating substrates with a first conductive layer and a first solder bonding layer in between, and a heat dissipation member in contact with other major surfaces of all of the insulating substrates with a second conductive layer and a second solder bonding layer in between, and each of the current paths is formed by connecting one or more of the MOS transistors mounted on one of the insulating substrates with one or more of the MOS transistors mounted on a different one of the insulating substrates in series with each other. The solder bonding may be performed with a sintered bonding material (silver sintering, copper sintering or the like), a conductive resin or the like.

(2) In the power substrate according to the above (1), it is preferable that a resistor is disposed between the insulating substrates adjacent to each other, and the resistor is connected in parallel with the MOS transistors.

(3) A high-voltage module according to an aspect of the present invention includes, stacked in this order, the power substrate according to the above (1), gate drive substrate on which a plurality of gate drive circuit elements of the MOS transistors are mounted, a power supply substrate including a plurality of coils on opposite sides thereof with an insulating member in between, and a control unit which simultaneously controls turning on and off of the plurality of gate drive circuit elements, and the MOS transistors and the gate drive circuit elements, the gate drive circuit elements and the coils, and the gate drive circuit elements and the control unit are electrically connected.

(4) In the high-voltage module according to the above (3), it is preferable that the control unit includes a CPLD substrate on which an EO converter is mounted to transmit an optical signal for on and off control to the gate drive circuit elements, and an O/E substrate including an OE converter which receives the optical signal to convert the optical signal into an electrical signal, and the OE converter of the control unit is electrically connected to the gate drive circuit elements.

Advantageous Effects of Invention

In a power substrate of the present invention, an insulating substrate on which MOS transistors are mounted is in contact with a heat dissipation member, and hence heat dissipation properties can improve as compared with conventional MOS transistors mounted in a discrete manner. Furthermore, in a high-voltage module including the power substrate of the present invention, a plurality of gate drive circuit elements are connected to one control unit, which is configured to simultaneously control the respective gate drive circuit elements. Therefore, gate signals can be simultaneously inputted into a plurality of MOS transistors connected in series, respectively, via the gate drive circuit elements, and hence gate delay variation among the MOS transistors can be kept low.

DESCRIPTION OF EMBODIMENTS

Hereinafter, description will be made as to a power substrate according to an embodiment to which the present invention is applied, and a high-voltage module equipped with the power substrate in detail with reference to the drawings. Note that the drawings for use in the following description may show a characteristic part in an enlarged manner for convenience to make characteristics easier to understand, and a dimension ratio or the like of respective components is not always the same as it actually is. Furthermore, a material, dimension or the like illustrated in the following description is merely an example, does not restrict the present invention, and can be appropriately changed and implemented without departing from the scope.

Figure 1:
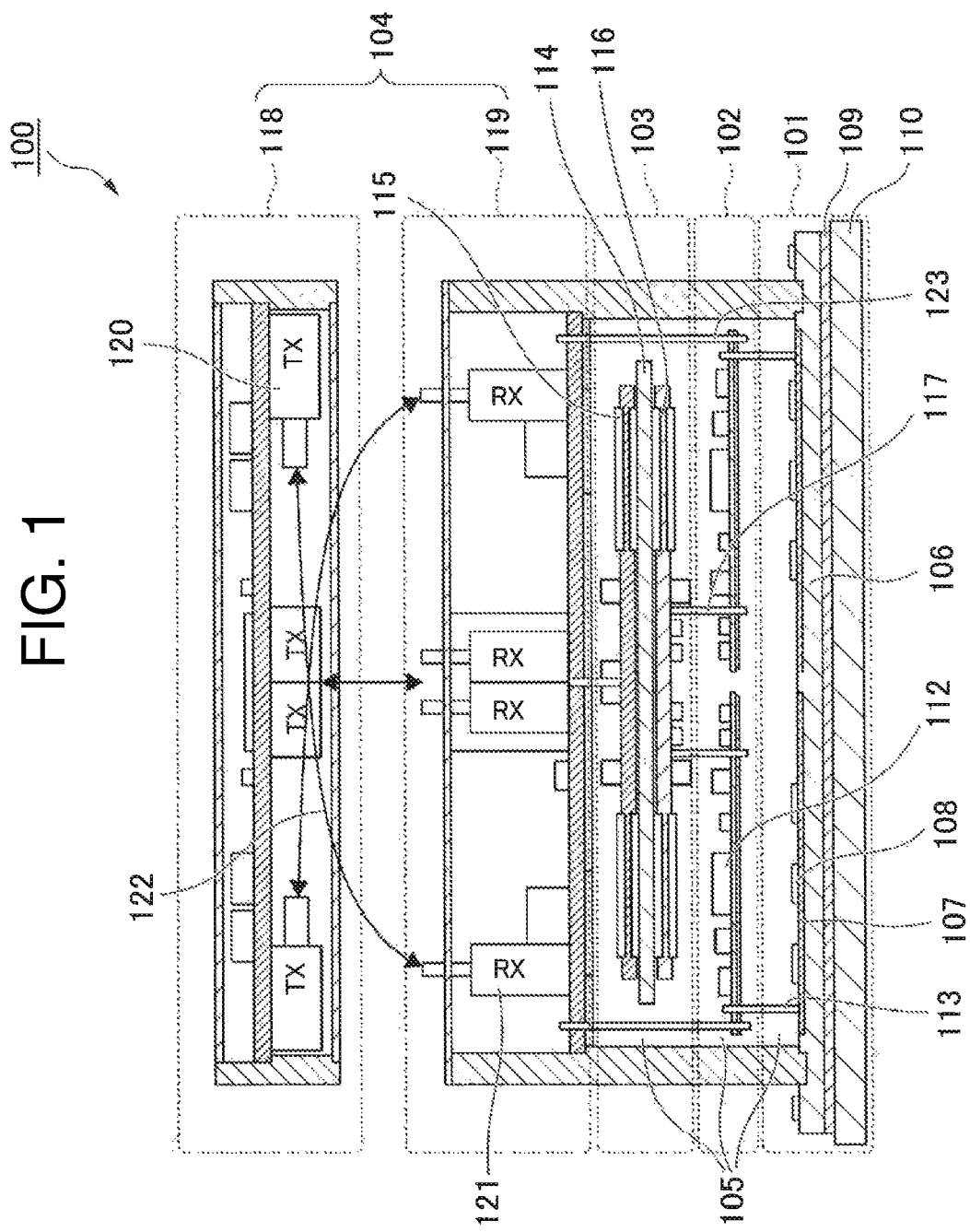
FIG. 1 is a cross-sectional view of a high-voltage module according to an embodiment of the present invention.

FIG. 1 is a cross-sectional view of a high-voltage module 100 according to an embodiment of the present invention. The high-voltage module 100 mainly includes a power substrate 101, a gate drive substrate 102, a power supply substrate 103, and a control unit 104, which are stacked in this order in respective thickness directions. Specifically, resins 105 are held between the power substrate 101 and the gate drive substrate 102, between the gate drive substrate 102 and the power supply substrate 103, and between the power supply substrate 103 and the control unit 104, respectively.

The power substrate 101 is a substrate on which a functional element such as an MOS transistor is mounted, includes a heat dissipation member having a large area, and is therefore preferably disposed in a lowermost layer of the high-voltage module 100 as shown in FIG. 1. The power substrate 101 includes a plurality of insulating substrates 106, a plurality of functional elements (chips) such as MOS transistors 108 mounted on one major surface of each of the insulating substrates 106 with a conductive layer 107 (first conductive layer) and a solder bonding layer 109 (first solder bonding layer) in between, and a heat dissipation member (heat spreader) 110 in contact with other major surfaces of all of the insulating substrates 106 with the conductive layer 107 (second conductive layer) and the solder bonding layer 109 (second solder bonding layer) in between. Here, functional elements other than the MOS transistors 108 are not shown in the drawing.

Insulating substrate 106 is mainly made of an insulating material such as alumina ($Al_2O_3$), aluminum nitride (AlN), or silicon nitride ($Si_3N_4$). The conductive layer 107 is mainly made of a conductive material such as copper, or aluminum. The surface of the conductive layer 107 may be plated with nickel, silver or the like.

Figure 2:
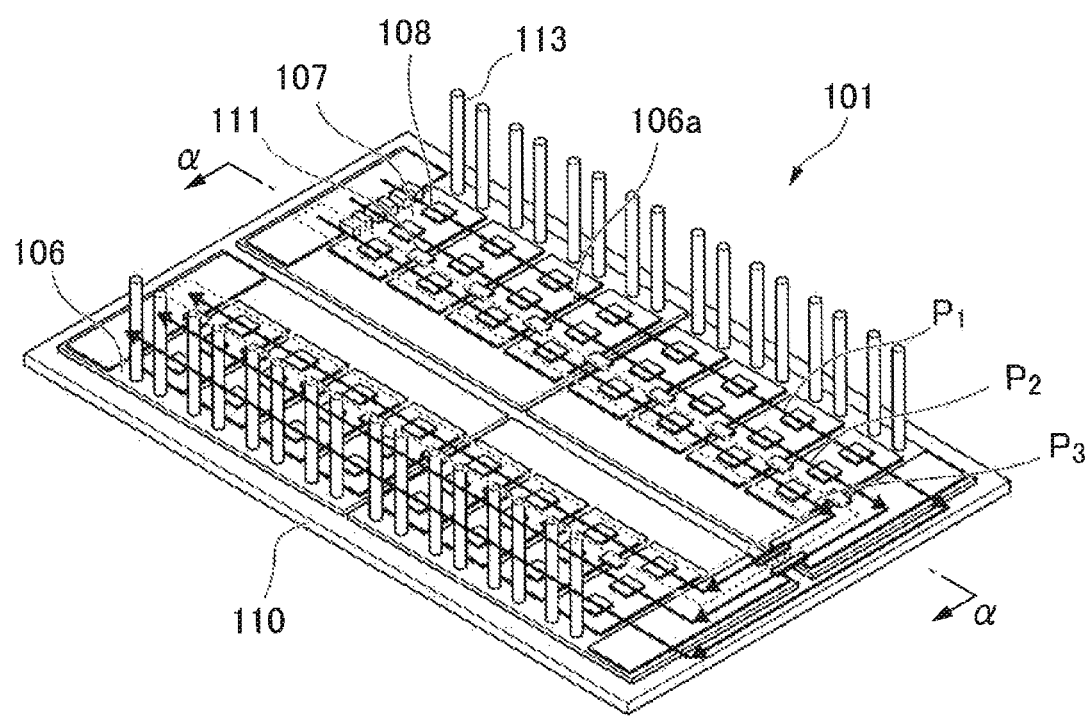
FIG. 2 is a perspective view of a power substrate included in the high-voltage module of FIG. 1.

FIG. 2 is a perspective view of the power substrate 101. The plurality of insulating substrates 106 are arranged side by side along a plurality of current paths P ($P_1$, $P_2$, . . . , $P_n$) aligned and extending in the same direction. In FIG. 2, n is three, but may be less than three, or equal to or more than four. Each of the current paths P has one end connected to a common input terminal (not shown), and the other end connected to a common output terminal (not shown). Note that "the same direction" herein means a direction connecting the common input terminal and output terminal, and extending directions of the plurality of current paths P do not have to be aligned in parallel in geometrical meaning.

Figure 3:
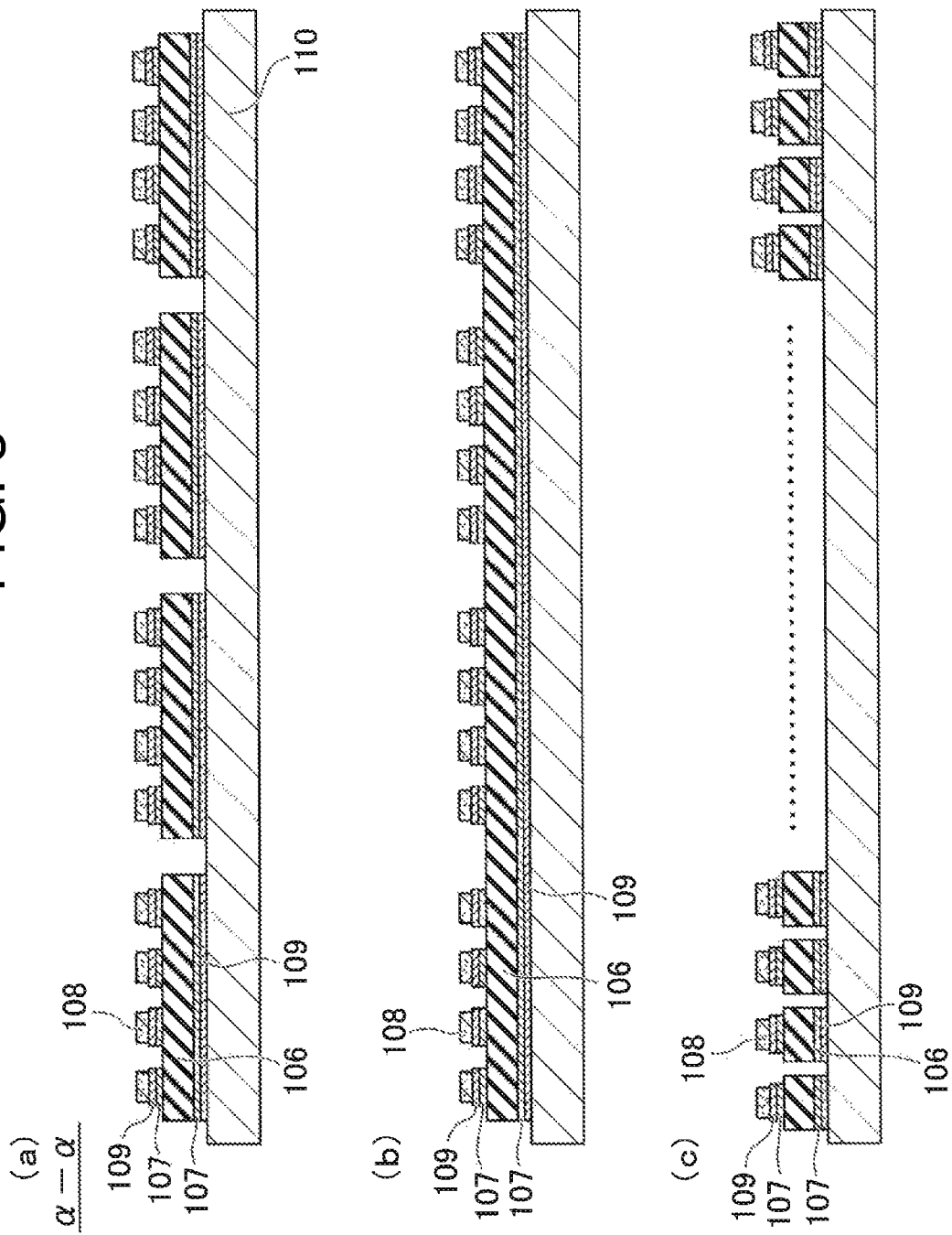
FIG. 3(a) is a cross-sectional view of the power substrate of FIG. 2.
FIGS. 3(b) and 3(c) are views showing modifications of the power substrate of FIG. 3(a).

FIG. 3(a) is a cross-sectional view in a case where the power substrate 101 of FIG. 2 is cut along a plane through which the α-α line passes. In each of the current paths $P_1$, $P_2$, . . . , and $P_n$, one or more (herein four) MOS transistors 108 are connected in series with each other among the MOS transistors 108 mounted on different insulating substrates 106. That is, one or more of the MOS transistors mounted on the same insulating substrate 106 are connected in series with one or more of the MOS transistors mounted on other insulating substrates 106. Here, a case where one current path P includes 16 MOS transistors 108 is illustrated, but there are not any restrictions on the number of the MOS transistors 108 to be connected in series.

FIGS. 3(b) and 3(c) are views showing modifications of the power substrate 101 shown in FIG. 3(a).

FIG. 3(a) illustrates a case where the number of the MOS transistors 108 mounted on the same insulating substrate 106 and belonging to the same current path P is four, but there are not any restrictions on this number.

For example, as shown in FIG. 3(b), the number of the MOS transistors 108 mounted on the same insulating substrate 106 and belonging to the same current path P may be increased. In this case, the insulating substrate 106 is large, and is therefore easy to assemble. Contrarily, as shown in FIG. 3(c), the number of the MOS transistors 108 mounted on the same insulating substrate 106 and belonging to the same current path P may be decreased. In this case, the insulating substrate 106 is small, and hence cost can be kept low, and occurrence of cracks or warp can be suppressed.

The MOS transistors 108 included in the same current path P are in series with each other, and the MOS transistors 108 included in the different current paths P are in parallel with each other. Furthermore, the plurality of MOS transistors 108 mounted on the different insulating substrates 106 are in series with each other, and the plurality of MOS transistors 108 mounted on the same insulating substrate 106 are in parallel with each other.

When the number of series connections is m, the MOS transistors 108 are arranged to form a m×n matrix structure. Here, a case where the current path P has a U-shape including a folded part is illustrated, but in a case where the number of the MOS transistors 108 is small, the current path may have a linear shape which does not include the folded part.

Figure 4:
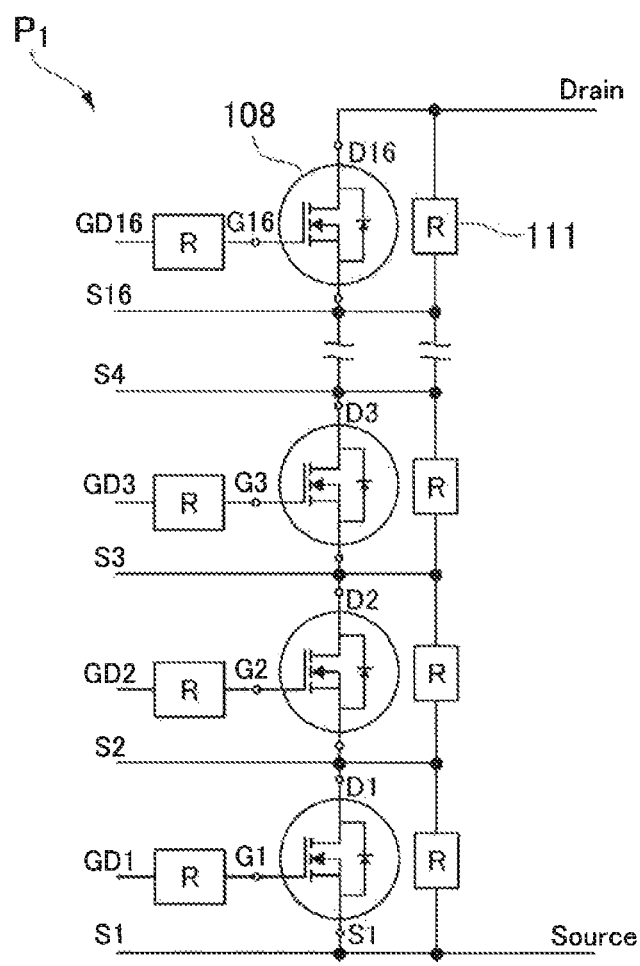
FIG. 4 is an equivalent circuit diagram of a current path formed in the power substrate of FIG. 2.

FIG. 4 is an equivalent circuit diagram concerning one current path (one of $P_1$, $P_2$, and $P_3$) among a plurality of current paths P included in the power substrate 101 of FIG. 2. Here, a case where 16 MOS transistors 108 are connected in series in one current path is illustrated. The plurality of (herein 16) MOS transistors 108 included in one current path are mounted on separate insulating substrates 106, respectively, and are configured not to conduct on a body side. Furthermore, gate electrodes of the plurality of MOS transistors 108 are connected to separate gate drive circuit elements GD, respectively.

It is preferable to dispose a resistor 111 between the insulating substrates 106 adjacent to each other for maintaining a partial pressure of each insulating substrate 106. An example of a material of the resistor 111 is carbon or the like.

The heat dissipation member 110 is made of a material with high thermal conductivity (e.g., copper, aluminum, an alloy material or the like), and has one surface directly in contact with at least all the insulating substrates 106 included in the power substrate 101. A surface of each insulating substrate 106 on a side opposite to a surface on which the functional elements are mounted is in contact with the heat dissipation member 110. The insulating substrate 106 on which the functional elements are mounted is in contact with the heat dissipation member, so that heat generated in the functional element can be easily dissipated to outside with the insulating substrate 106 and the heat dissipation member 110 in between. Consequently, for the functional element, damages caused by heat generation are reduced, and a large current can therefore keep flowing.

The plurality of insulating substrates 106 are arranged away from each other to form respective islands on one surface of the heat dissipation member 110. Consequently, the MOS transistors 108 mounted on the adjacent insulating substrates 106 can be prevented from short-circuiting to each other, and a withstand voltage for each insulating substrate 106 can be improved.

The MOS transistors 108 mounted on the respective insulating substrates 106 are connected in series with each other over a plurality of stages via a wiring (not shown) across a groove 106a formed between the adjacent insulating substrates 106. That is, each of the plurality of MOS transistors 108 mounted on one of the adjacent insulating substrates 106 is connected in series with each of the plurality of MOS transistors 108 mounted on the other insulating substrate 106 in one-to-one correspondence. Specifically, a source electrode or a drain electrode of one of two adjacent MOS transistors 108 is connected to a drain electrode or a source electrode of the other MOS transistor, and the source electrodes and the drain electrodes are alternately arranged over the whole current path P.

The gate drive substrate 102 is a substrate on which a plurality of gate drive circuit elements 112 of the MOS transistors 108 are mounted. The gate drive substrate 102 is disposed and connected to be stacked on the surface of the power substrate 101 on a side on which the functional elements are mounted.

The plurality of gate drive circuit elements 112 are electrically connected to the plurality of MOS transistors 108 on the insulating substrate 106, respectively, via a wiring 113 penetrating between the gate drive substrate 102 and the power substrate 101. That is, one gate drive circuit element 112 is configured to apply a gate voltage to the plurality of (herein three) MOS transistors 108 mounted on one conductive layer 107 via the wiring 113. From a viewpoint of reducing effects of noise, it is preferable that the gate drive circuit element 112 is disposed directly above the MOS transistors 108 to which the gate voltage is applied, to shorten the wiring 113.

It is further preferable that the gate drive substrate 102 is arranged directly above and substantially parallel to the power substrate 101. With this arrangement, a distance between the gate drive circuit element 112 and the MOS transistor 108 is shortest and substantially uniform regardless of a position, and a length of the wiring 113 is substantially uniform. This can avoid a problem that a voltage of noise or the like is applied to some of the MOS transistors 108.

The power supply substrate 103 includes a plurality of coils 115 and 116 on opposite sides thereof with an insulating member 114 in between. The power supply substrate 103 is configured such that a voltage inputted to the coil (primary coil) 115 provided on one side with the insulating member 114 in between is converted into a desirable size by magnetic field coupling, and the voltage is outputted from the coil (secondary coil) 116 provided on the other side.

Figure 5:
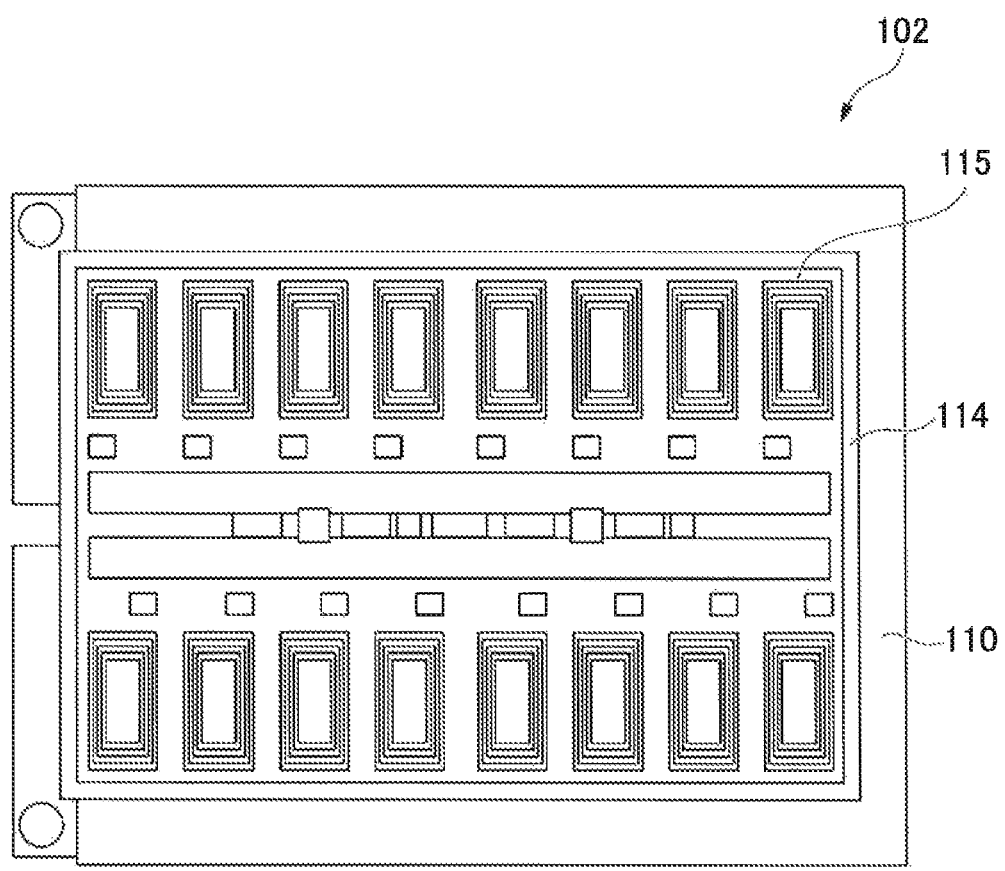
FIG. 5 is a plan view of a power supply substrate included in the high-voltage module of FIG. 1.

FIG. 5 is a plan view of the power supply substrate 103 seen from a primary coil 115 side. The secondary coil 116 is disposed at a position overlapping with the primary coil 115 on an opposite side with the insulating member 114 in between. To improve efficiency of the magnetic field coupling, it is preferable that the primary coil 115 and the secondary coil 116 are arranged with central axes overlapping with each other.

The power supply substrate 103 is disposed to face the gate drive substrate 102 on a secondary coil 116 side, and configured such that the outputted voltage is applied to the gate drive circuit element 112. Specifically, a plurality of secondary coils 116 are electrically connected to the plurality of gate drive circuit elements 112, respectively, via a wiring 117 penetrating between the power supply substrate 103 and the gate drive substrate 102. That is, one secondary coil 116 is configured to apply a signal voltage to one gate drive circuit element 112 via the wiring 117.

The control unit 104 includes a complexed programmable logic device (CPLD) substrate 118 on which an EO converter is mounted to simultaneously transmit an optical signal for on and off control to the plurality of gate drive circuit elements 112, and an O/E substrate 119 including an OE converter which receives the optical signal to convert the optical signal into an electrical signal. An optical transmitter 120 in the CPLD substrate 118 is connected to an optical receiver 121 in the O/E substrate 119 via an optical fiber 122. The optical receiver 121 is electrically connected to the gate drive circuit element 112 via a wiring 123 penetrating between the O/E substrate 119 and the gate drive substrate 102.

In the power substrate 101 according to the present embodiment, the insulating substrate 106 on which the MOS transistors 108 are mounted is in contact with the heat dissipation member 110, and hence heat dissipation properties can improve as compared with conventional MOS transistors mounted in a discrete manner. Furthermore, in the high-voltage module 100 including the power substrate 101 according to the present embodiment, the plurality of gate drive circuit elements 112 are connected to one control unit 104, which is configured to simultaneously control the respective gate drive circuit elements 112. Therefore, gate signals can be simultaneously inputted into the plurality of MOS transistors 108 connected in series, respectively, via the gate drive circuit elements 112, and hence gate delay variation among the MOS transistors 108 can be kept low.

REFERENCE SIGNS LIST 100 high-voltage module
101 power substrate
102 gate drive substrate
103 power supply substrate
104 control unit
105 resin
106 insulating substrate
106a groove
107 conductive layer
108 MOS transistor
109 solder bonding layer
110 heat dissipation member
111 resistor
112 gate drive circuit element
113 wiring
114 insulating member
115 primary coil
116 secondary coil
117 wiring
118 CPLD substrate
119 O/E substrate
120 optical transmitter
121 optical receiver 122 optical fiber
123 wiring
P, $P_1$, $P_2$, and $P_3$ current path

The invention claimed is:

1. A single power substrate comprising:
a plurality of insulating substrates arranged side by side along a plurality of current paths extending in a same direction,
a plurality of first conductive layer and a plurality of first solder bonding layer formed on one major surface of each of the plurality of insulating substrates,
a plurality of MOS transistors mounted on one major surface of each of the plurality of insulating substrates with plurality of first conductive layer and a first solder bonding layer in between, and
a single heat dissipation member in contact with other major surfaces of all of the insulating substrates with a second conductive layer and a second solder bonding layer in between,
wherein the plurality of MOS transistors include a first MOS transistor mounted on one of the first conductive layer and a second MOS transistor mounted on an adjacent one of the first conductive layer,
wherein the first MOS transistor and the second MOS transistor each include a plurality of MOS transistors connected in parallel, and
wherein each of the current paths is formed by electrically series-connecting the first MOS transistor and the second MOS transistor in a forward direction.

2. The power substrate according to claim 1, wherein a resistor is disposed between the insulating substrates adjacent to each other, and the resistor is connected to the source and drain of the MOS transistor, thereby being connected in parallel with the MOS transistors.

3. A high-voltage module comprising, stacked in this order:
the power substrate according to claim 1,
a gate drive substrate on which a plurality of gate drive circuit elements of the MOS transistors are mounted,
a power supply substrate comprising a plurality of coils on opposite sides thereof with an insulating member in between, and
a control unit which simultaneously controls turning on and off of the plurality of gate drive circuit elements,
wherein the MOS transistors and the gate drive circuit elements, the gate drive circuit elements and the coils, and the gate drive circuit elements and the control unit are electrically connected.

4. The high-voltage module according to claim 3, wherein the control unit comprises:
a CPLD substrate on which an EO converter is mounted to transmit an optical signal for on and off control to the gate drive circuit elements, and
an O/E substrate comprising an OE converter which receives the optical signal to convert the optical signal into an electrical signal, and
the OE converter of the control unit is electrically connected to the gate drive circuit elements.

* * * * *